(12) United States Patent
Jin et al.

(10) Patent No.: US 8,283,711 B2
(45) Date of Patent: Oct. 9, 2012

(54) NON-VOLATILE MEMORY DEVICES HAVING DATA STORAGE LAYER

(75) Inventors: Young-gu Jin, Hwaseong-si (KR); Yoon-dong Park, Yongin-si (KR); Won-joo Kim, Hwaseong-si (KR); Seung-hoon Lee, Seoul (KR); Suk-pil Kim, Yongin-si (KR)

(73) Assignee: Samsung Electronics Co., Ltd., Geyonggi-Do (KR)

( * ) Notice: Subject to any disclaimer, the term of this patent is extended or adjusted under 35 U.S.C. 154(b) by 606 days.

(21) Appl. No.: 12/149,209

(22) Filed: Apr. 29, 2008

(65) Prior Publication Data

US 2009/0141547 A1 Jun. 4, 2009

(30) Foreign Application Priority Data

Nov. 29, 2007 (KR) .................. 10-2007-0122732

(51) Int. Cl.
*H01L 29/792* (2006.01)

(52) U.S. Cl. ............... 257/295; 257/310; 257/E45.002; 257/5

(58) Field of Classification Search ............ 257/5, 298, 257/303, 306, 307, 314, 295, 310, E45.002
See application file for complete search history.

(56) References Cited

U.S. PATENT DOCUMENTS

| | | | | |
|---|---|---|---|---|
| 7,755,934 B2 * | 7/2010 | Toda et al. ................ | 365/163 |
| 2005/0180248 A1 * | 8/2005 | Scheuerlein ............ | 365/230.03 |
| 2006/0170027 A1 * | 8/2006 | Lee et al. .................. | 257/314 |
| 2006/0186446 A1 * | 8/2006 | Kim et al. .................. | 257/296 |
| 2006/0197131 A1 * | 9/2006 | Yoon et al. ................ | 257/296 |
| 2008/0025078 A1 * | 1/2008 | Scheuerlein et al. ...... | 365/163 |
| 2008/0061333 A1 * | 3/2008 | Hidaka ...................... | 257/295 |
| 2008/0111120 A1 * | 5/2008 | Lee et al. ................... | 257/2 |
| 2009/0026460 A1 * | 1/2009 | Ou et al. .................... | 257/66 |

FOREIGN PATENT DOCUMENTS

WO  WO 2006/115208   11/2006

OTHER PUBLICATIONS

Chinese Office Action dated Dec. 21, 2011.

* cited by examiner

*Primary Examiner* — Howard Weiss
*Assistant Examiner* — Tifney Skyles
(74) *Attorney, Agent, or Firm* — Harness, Dickey & Pierce, P.L.C.

(57) ABSTRACT

Provided are a non-volatile memory device, which may have a stacked structure and may be easily integrated at increased density, and a method of fabricating and using the non-volatile memory device. The non-volatile memory device may include at least one pair of first electrode lines. At least one second electrode line may be between the at least one pair of first electrode lines. At least one data storage layer may be between the at least one pair of first electrode lines and the at least one second electrode line and may locally store a resistance change.

18 Claims, 10 Drawing Sheets

NON-VOLATILE MEMORY DEVICES HAVING DATA STORAGE LAYER

PRIORITY STATEMENT

This application claims priority under 35 U.S.C. §119 to Korean Patent Application No. 10-2007-0122732, filed on Nov. 29, 2007, in the Korean Intellectual Property Office (KIPO), the entire contents of which are herein incorporated by reference.

BACKGROUND

1. Field

Example embodiments relate to a semiconductor device and methods of fabricating and using the same. Other example embodiments relate to a non-volatile memory device using a data storage layer that may store a resistance change and methods of fabricating and using the non-volatile memory device.

2. Description of the Related Art

Semiconductor products are becoming increasingly miniaturized and also are being required to process more data. Thus, high-speed and highly integrated non-volatile memory devices are in demand for use in semiconductor products. In this regard, non-volatile memory devices having a multi-layer structure offer a greater degree of integration than conventional non-volatile memory devices having a single-layer structure.

Non-volatile memory devices having a multi-layer structure are configured such that a plurality of memory cells are vertically stacked on the same area. However, the non-volatile memory devices having the multi-layer structure may have a problem in that it is difficult to connect the stacked memory cells and select one of them. The non-volatile memory devices having the multi-layer structure may have another disadvantage in that as the number of the stacked memory cells increases, manufacturing processes and/or manufacturing costs may increase.

SUMMARY

Example embodiments provide a non-volatile memory device that may have a stacked structure and may be easily integrated at an increased density. Example embodiments also provide methods of more economically fabricating and using the non-volatile memory device.

According to example embodiments, a non-volatile memory device may include at least one pair of first electrode lines, at least one second electrode line between the at least one pair of first electrode lines, and at least one data storage layer between the at least one pair of first electrode lines and the at least one second electrode line and locally storing a resistance change.

The at least one pair of first electrode lines may include a semiconductor of a first conductive type, and the at least one second electrode line may include a semiconductor of a second conductive type that is opposite to the first conductive type.

The non-volatile memory device may include a first semiconductor layer of a first conductive type between the at least one second electrode line and the at least one data storage layer, and a second semiconductor layer of a second conductive type, which is opposite to the first conductive type, between the first semiconductor layer and the at least one second electrode line.

The at least one pair of first electrode lines may include a plurality of first electrode lines arranged parallel to one another, wherein the at least one second electrode line may include a plurality of second electrode lines between the plurality of first electrode lines. The non-volatile memory device may further include a first word line electrically connecting even first electrode lines among the plurality of first electrode lines, and a second word line electrically connecting odd first electrode lines among the plurality of first electrode lines.

The at least one pair of first electrode lines may include a plurality of pairs of first electrode lines stacked in a plurality of layers. The at least one second electrode line may perpendicularly extend along the stack of first electrode lines.

According to example embodiments, a method of fabricating a non-volatile memory device may include forming at least one pair of first electrode lines, forming at least one data storage layer along sidewalls of the at least one pair of first electrode lines wherein the at least one data storage layer may locally store a resistance change, and forming at least one second electrode line on the at least one data storage layer between the at least one pair of first electrode lines.

Forming the at least one pair of first electrode lines may include alternately stacking a plurality of first electrode layers and a plurality of insulating layers and forming a plurality of trenches in the plurality of first electrode layers to define a plurality of first electrode lines. Forming the at least one second electrode line may include filling a second electrode layer in the plurality of trenches and patterning the second electrode layer to define a plurality of second electrode lines.

Forming the at least one second electrode line may include forming at least one data storage layer so as to fill the plurality of trenches, forming a plurality of holes in the at least one data storage layer, and forming a plurality of second electrode lines in the plurality of holes.

According to example embodiments, a method of using a non-volatile memory device may include applying a program voltage between a first electrode line and a second electrode line so as to induce a resistance change in at least one data storage layer, wherein the first electrode line is one of at least one pair of first electrode lines and the second electrode line is between the pair of first electrode lines, and the at least one data storage layer is between the first electrode line and the second electrode line, and applying a read voltage between the first electrode and the second electrode line so as to determine the resistance change in the at least one data storage layer.

BRIEF DESCRIPTION OF THE DRAWINGS

Example embodiments will be more clearly understood from the following detailed description taken in conjunction with the accompanying drawings.

FIG. 1 is a perspective view of a non-volatile memory device having a basic structure according to example embodiments;

FIG. 2 is a perspective view of a non-volatile memory device having a single-layer array structure according to example embodiments;

FIG. 3 is a perspective view of a non-volatile memory device having a stacked structure according to example embodiments;

FIG. 4 is a cross-sectional view taken along line IV-IV' of the nonvolatile memory device of FIG. 3 according to example embodiments;

FIG. 5 is a perspective view of a non-volatile memory device having a stacked structure according to example embodiments;

FIG. 6 is a perspective view of a non-volatile memory device having a basic structure according to example embodiments;

FIG. 7 is a perspective view of a non-volatile memory device having a stacked structure according to example embodiments;

FIG. 8 is a cross-sectional view taken along line VIII-VIII' of the non-volatile memory device of FIG. 7;

FIGS. 9 through 14 are perspective views illustrating a method of fabricating a non-volatile memory device according to example embodiments;

FIGS. 15 through 17 are perspective views illustrating a method of fabricating a non-volatile memory device according to example embodiments; and FIGS. 18 and 19 are perspective views illustrating a method of fabricating a non-volatile memory device according to example embodiments.

DETAILED DESCRIPTION OF EXAMPLE EMBODIMENTS

Figure 1:
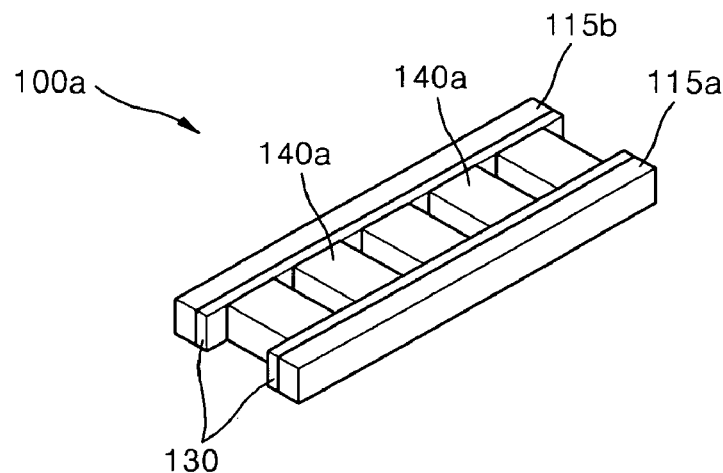
FIGS. 1-19 represent non-limiting, example embodiments as described herein.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements of features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes of regions of elements, and do not limit example embodiments.

Hereinafter, the structure of a non-volatile memory device according to example embodiments and the method of manufacturing the non-volatile memory device will be described in detail with reference to FIGS. 1 to 19.

FIG. 1 is a perspective view of a non-volatile memory device 100a which may have a basic structure according to example embodiments. Referring to FIG. 1, the non-volatile memory device 100a may include a pair of first electrode lines 115a and 115b. The first electrode lines 115a and 115b may be spaced apart from each other by a predetermined or given distance, and may extend parallel to each other. However, example embodiments are not limited thereto. For example, the first electrode lines 115a and 115b may not be parallel to each other or may be partially parallel to each other while being partially non-parallel to each other.

A plurality second electrode lines 140a may be interposed between the first electrode lines 115a and 115b. The second electrode lines 140a may be spaced apart from one another along the extension of the first electrode lines 115a and 115b. The number of the second electrode lines 140a may be determined by the length of the first electrode lines 115a and 115b, but example embodiments are not limited thereto. For example, one second electrode line 140a may be interposed between the first electrode lines 115a and 115b, or, alternatively, a given number of second electrode lines 140a may be interposed between the first electrode lines 115a and 115b. Although each of the second electrode lines 140a has a square pillar shape in FIG. 1, example embodiments are not limited thereto. For example, the second electrode lines 140a may have a cylindrical shape or various other polyprism shapes.

The first electrode lines 115a and 115b may include a semiconductor of a first conductive type, and the second electrode lines 140a may include a semiconductor of a second conductive type that is opposite to the first conductive type. For example, any one of the first conductive type and the second conductive type may be an n-type, and the remaining one may be a p-type. However, example embodiments are not limited thereto, and the first electrode lines 115a and 115b and the second electrode lines 140a may include conductors.

At least one data storage layer 130 may be interposed between the first electrode lines 115a and 115b and the second electrode lines 140a. For example, the at least one data storage layer 130 may be disposed as one pair of layers on sidewalls of the first electrode lines 115a and 115b to extend along the first electrode lines 115a and 115b. The pair of data storage layers 130 may be connected to each other to form one layer. Alternatively, the at least one data storage layer 130 may be disposed as a plurality of layers defined between the first electrode lines 115a and 115b and the second electrode lines 140a. However, example embodiments are not limited thereto, and the at least one data storage layer 130 may be modified in various ways.

The at least one data storage layer 130 may control current flowing between the first electrode lines 115a and 115b and the second electrode lines 140a. The at least one data storage layer 130 may locally store a resistance change. For example, the at least one data storage layer 130 may have higher resistance, lower resistance, or insulator characteristics according to a voltage applied thereto. Such variable characteristics of the at least one data storage layer 130 may be used for the non-volatile memory device 100a to store data.

For example, the at least one data storage layer 130 may include a phase-change resistor. In example embodiments, the non-volatile memory device 100a may act as a phase-change random access memory (PRAM). For example, the phase-change resistor may include a chalcogenide compound, e.g., as $Ge_2Sb_2Te_5$ (GST). The phase-change resistor may have a higher resistance state or a lower resistance state according to its crystalline state.

The at least one data storage layer 130 may include a variable resistor. In example embodiments, the non-volatile memory device 100a may act as a resistance random access memory (RRAM). Unlike the phase-change resistor, the variable resistor may have a resistance that changes, irrespective of its crystalline state. However, the variable resistor may include a phase-change resistor. For example, the variable resistor may include NiO, $Nb_2O_5$, or ZnO.

Alternatively, the at least one data storage layer 130 may include a material having a dielectric breakdown. For example, the at least one data storage layer 130 may include a material, e.g., an oxide, which may have an electrical breakdown according to a voltage applied to the material. Because the material having the dielectric breakdown may not return to an insulating state, the non-volatile memory device 100a may be used as a one-time programmable (OTP) memory device. The OPT memory device may be used in products requiring relatively high memory capacity.

In the non-volatile memory device 100a, the first electrode lines 115a and 115b may be used as parts of one pair of word lines, and the second electrode lines 140a may be used as parts of bit lines. Because the word lines and the bit lines are structurally similar to each other in the non-volatile memory device 100a, the word lines and the bit lines may be exchanged. If the at least one data storage layer 130 is conductive, the first electrode lines 115a and 115b and the second electrode lines 140a may form a diode junction. Accordingly, the first electrode lines 115a and 116b and the second electrode lines 140a may be divided into bit lines and word lines according to the bias orientation of the diode junction.

The second electrode lines 140a may be shared between the first electrode lines 115a and 115b. Accordingly, one memory cell may be defined between one of the first electrode lines 115a and 115b and one of the second electrode lines 140a. Accordingly, one pair of memory cells may be defined on both sides of each of the second electrode lines 140a.

Programming of a memory cell may be performed by applying a program voltage between one of the first electrode lines 115a and 115b and one of the second electrode lines 140a. In example embodiments, the programming may be locally performed at the at least one data storage layer 130 around a shortest path between the selected one of the second electrode lines 140a and the selected one of the first electrode lines 115a and 115b due to current channeling. That is, a resistance change may locally occur in the at least one data storage layer 130. Accordingly, even though the at least one data storage layer 130 is provided as one pair of layers, the programming may be performed locally.

Reading of a memory cell may be performed by applying a read voltage between one of the first electrode lines 115a and 115b and one of the second electrode lines 140a. A local resistance change in the at least one data storage layer 130 may be determined by measuring the amount of current.

Figure 2:
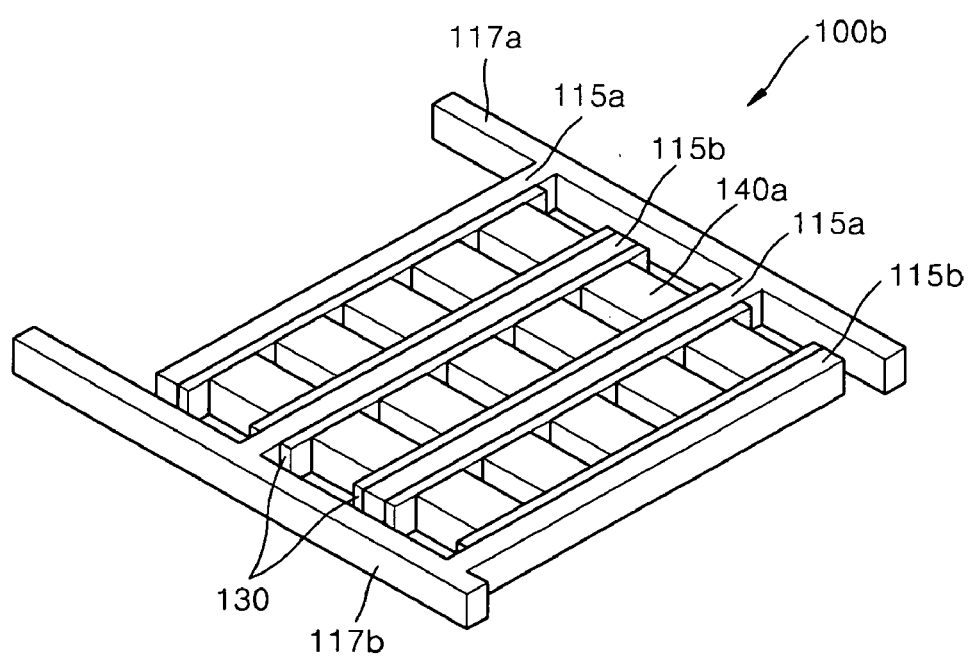

FIG. 2 is a perspective view of a non-volatile memory device 100b having a single-layer array structure according to example embodiments. Referring to FIG. 2, first electrode lines 115a and 115b may be arranged in an array-type. For example, the first electrode lines 115a and 115b may be arranged in a plurality of parallel columns. That is, the non-volatile memory device 100b may be formed by arranging a plurality of non-volatile memory devices 100a of FIG. 1 in columns. Each of the first electrode lines 115a and 115b may be shared between second electrode lines 140a that are arranged in different columns.

The first electrode lines 115a and 115b may be alternately arranged. For example, the first electrode lines 115a may be arranged in even columns, and the first electrode lines 115b may be arranged in odd columns. Alternatively, the first electrode lines 115a may be arranged in odd columns, and the first electrode lines 115b may be arranged in even columns. Accordingly, the first electrode lines 115a and 115b may be alternately arranged in columns.

A first word line 117a may electrically connect the first electrode lines 115a, and a second word line 117b may electrically connect the first electrode lines 115b. The first word line 117a and the second word line 117b may be separately disposed on both ends of the first electrode lines 115a and 115b. For example, the first word line 117a may be connected to ends of the first electrode lines 115a and the second word line 117b may be connected to the other ends of the first electrode lines 115b.

In example embodiments, the first electrode lines 115a may be parts of the first word line 117a. Likewise, the first electrode lines 115b may be parts of the second word line 117b. The first electrode lines 115a may be selected by selecting the first word line 117a and the first electrode lines 115b may be selected by selecting the second word line 117b. In example embodiments, second electrode lines 140a arranged in different columns may be independently selected.

Figure 3:
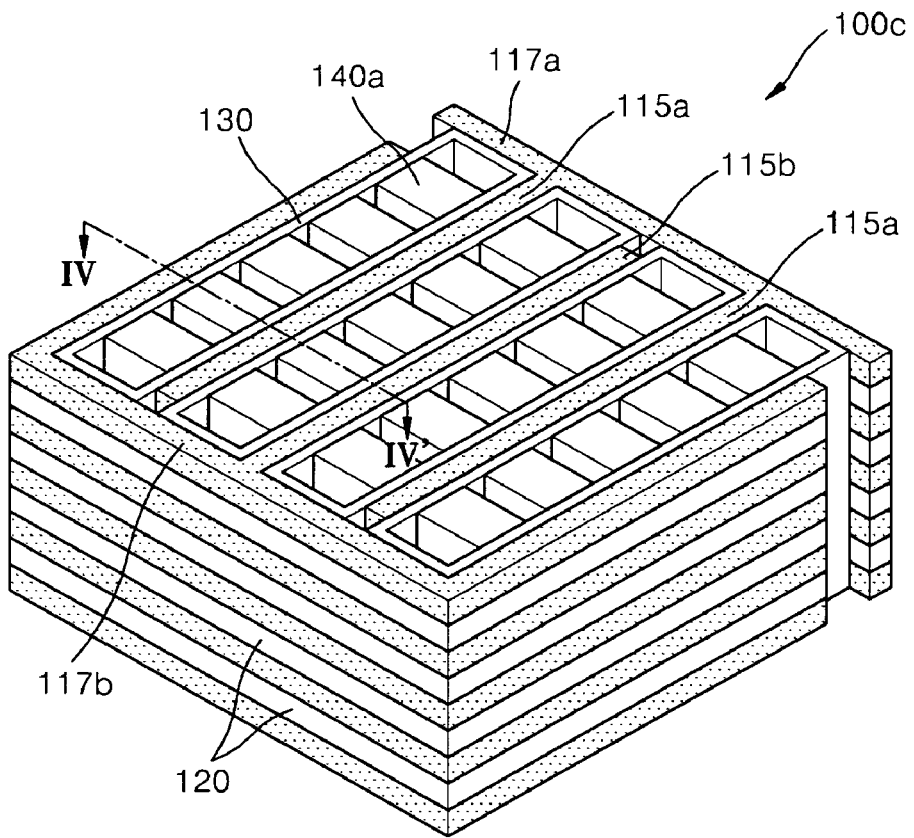
Figure 4:
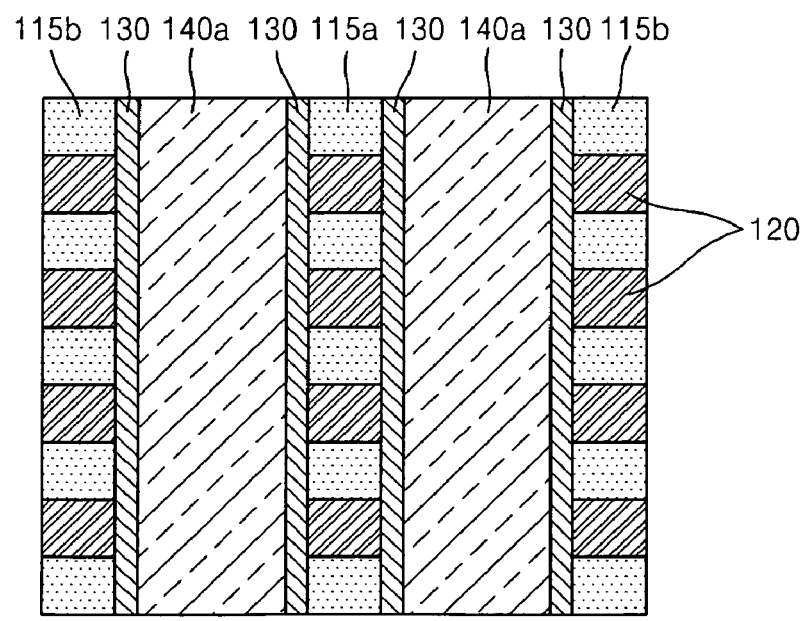

FIG. 3 is a perspective view of a non-volatile memory device 100c having a stacked structure according to example embodiments. FIG. 4 is a cross-sectional view taken along line IV-IV' of the non-volatile memory device 100c of FIG. 3. Referring to FIGS. 3 and 4, a plurality of non-volatile memory devices 100b of FIG. 2 may be stacked in a plurality of layers. For example, a plurality of pairs of first electrode lines 115a and 115b may be stacked in a plurality of layers. In example embodiments, an insulating layer 120 may be interposed between first electrode lines 115a and 115b that are stacked in different layers. A plurality of pairs of first and second word lines 117a and 117b may also be stacked in a plurality of layers like the first electrode lines 115a and 115b. Accordingly, first electrode lines 115a and 115b belonging to different layers may be separated from one another, and first and second word lines 117a and 117b belonging to different layers may be separated from one another.

Second electrode lines 140a may perpendicularly extend along sidewalls of the stack of first electrode lines 115a and 115b. Accordingly, the second electrode lines 140a may be shared by the first electrode lines 115a and 115b that are arranged in different layers. Although the second electrode lines 140a may be shared by the first electrode lines 115a and 115b are be arranged in the different layers, because the first electrode lines 115a and 115b are separated from each other, memory cells belonging to the different layers may be operated separately.

The at least one data storage layer 130 may perpendicularly extend along the sidewalls of the stack of first electrode lines 115a and 115b. The at least one data storage layer 130 may extend up to sidewalls of the first and second word lines 117a and 117b. For example, the at least one data storage layer 130 may have a cylindrical shape surrounding sidewalls of the second electrode lines 140a arranged in a column. Because the at least one data storage layer 130 may locally store a resistance change as described above, the at least one data storage layer 130 may be shared in various manners by the memory cells.

The operation of the non-volatile memory device 100c is almost the same as that of the non-volatile memory device 100a of FIG. 1 and the non-volatile memory device 100b of FIG. 2, and thus a repeated explanation will not be given. The memory cells of the non-volatile memory device 100c, which are stacked in a plurality of layers, may be operated separately. Accordingly, the non-volatile memory device 100c may have increased capacity by increasing the number of the stack of memory cells, e.g., the number of the stack of first electrode lines 115a and 115b. Nevertheless, because the non-volatile memory device 100c may have the same cross-sectional area as that of the non-volatile memory device 100b of FIG. 2, the non-volatile memory device 100c may offer a higher degree of integration. Accordingly, the non-volatile memory device 100 may be suitable for highly-integrated high-capacity products.

Figure 5:
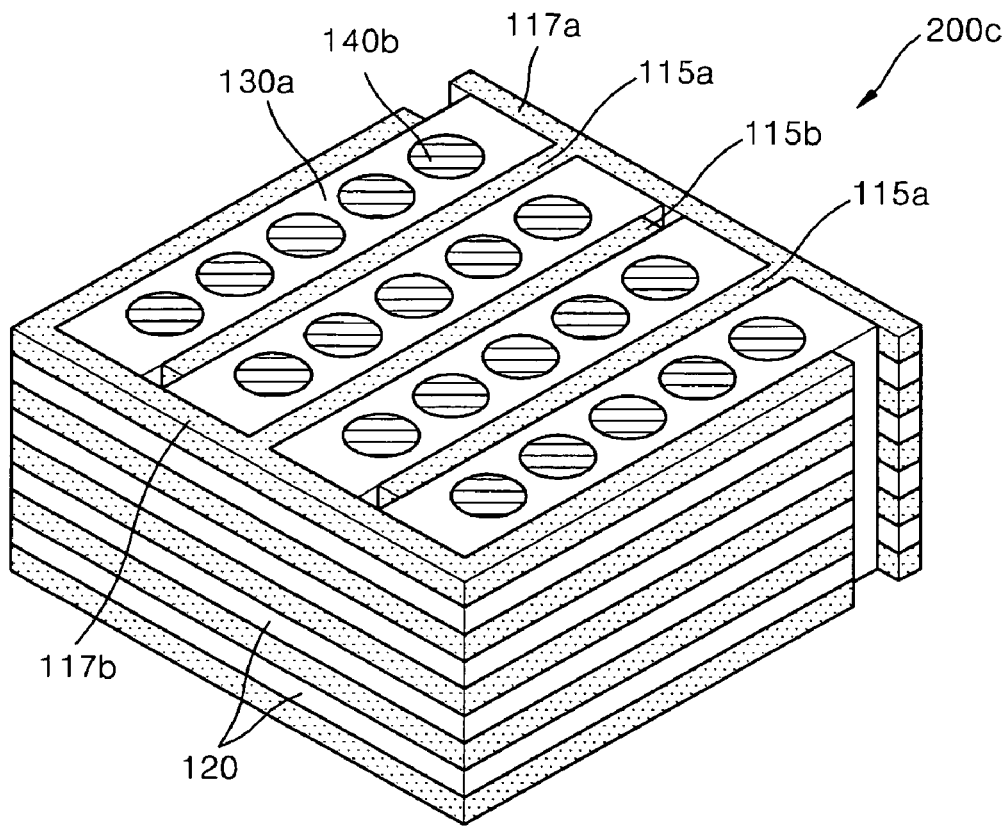

FIG. 5 is a perspective view of a non-volatile memory device 200c having a stacked structure according to example embodiments. The non-volatile memory device 200c may be a modification of the non-volatile memory device 100c of FIG. 3, and thus a repeated explanation thereof will not be given. Referring to FIG. 5, each of second electrode lines 140b may have a cylindrical shape. However, example embodiments are not limited thereto, and the second electrode lines 140b may have a square pillar shape as shown in FIG. 3 or other polyprism shapes.

The at least one data storage layer 130a may surround the second electrode lines 140b. Accordingly, the at least one data storage layer 13a may fill between first electrode lines 115a and 115b, and the second electrode lines 140b may be recessed into the at least one data storage layer 130a.

A resistance change of the at least one data storage layer 130a of the non-volatile memory device 200c may locally occur around a shortest path between the first electrode lines 115a and 115b and the second electrode lines 140b. Accordingly, the operation of the non-volatile memory device 200c may be almost the same as that of the non-volatile memory device 100c of FIG. 3.

Although not shown, non-volatile memory devices having a basic structure and a single-layer array structure may be easily deduced from the non-volatile memory device 200c with reference to the non-volatile memory device 100a having the basic structure of FIG. 1 and the non-volatile memory device 100b having the single-layer array structure of FIG. 2.

Figure 6:
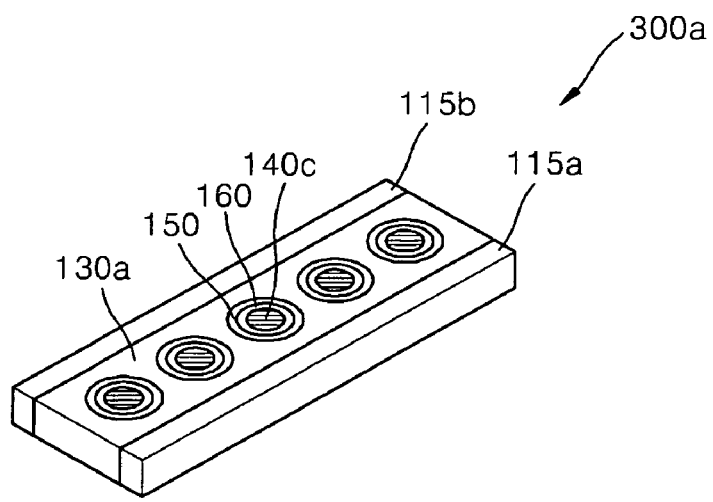

FIG. 6 is a perspective view of a non-volatile memory device 300a having a basic structure according to example embodiments. The non-volatile memory device 300a is a modification of the non-volatile memory device 100a of FIG. 1, and thus a repeated explanation thereof will not be given. Referring to FIG. 6, each of second electrode lines 140c may have a cylindrical shape. However, example embodiments are not limited thereto, and each of the second electrode lines 140c may have a square pillar shape as shown in FIG. 1, or may have other polyprism shapes. The at least one data storage layer 130a may surround the second electrode lines 140c. Accordingly, the at least one data storage layer 130a may fill between first electrode lines 115a and 115b, and the second electrode lines 140c may be recessed into the at least one data storage layer 130a.

A first semiconductor layer 150 may be interposed between the second electrode lines 140c and the at least one data storage layer 130a, and a second semiconductor layer 160 may be interposed between the first semiconductor layer 150 and the second electrode lines 140c. For example, the second semiconductor layer 160 may surround the second electrode lines 140c, and the first semiconductor layer 150 may surround the second semiconductor layer 160.

The first semiconductor layer 150 and the second semiconductor layer 160 may form a diode junction. For example, when the first semiconductor layer 150 is of a first conductive type, the second semiconductor layer 160 may be of a second conductive type that is opposite to the first conductive type. The diode junction may rectify current flowing between the first electrode lines 115a and 115b and the second electrode lines 140c. The first electrode lines 115a and 115b and the second electrode lines 140c may include conductors. The operation of the non-volatile memory device 300a is almost the same as that of the non-volatile memory device 100a of FIG. 1, and thus a repeated explanation thereof will not be given.

Figure 7:
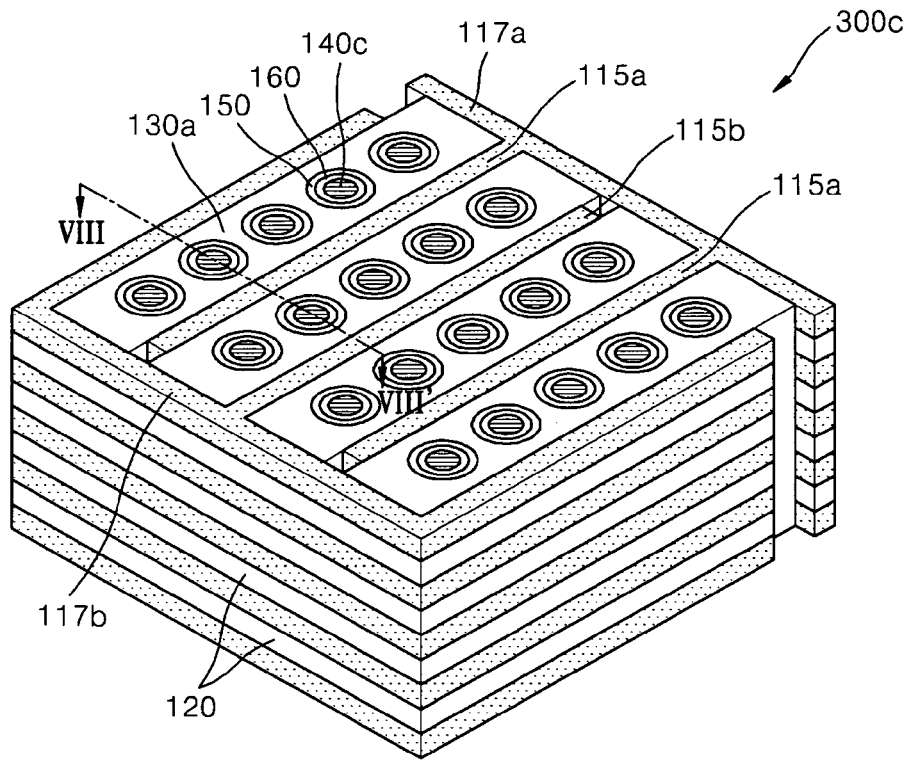
Figure 8:
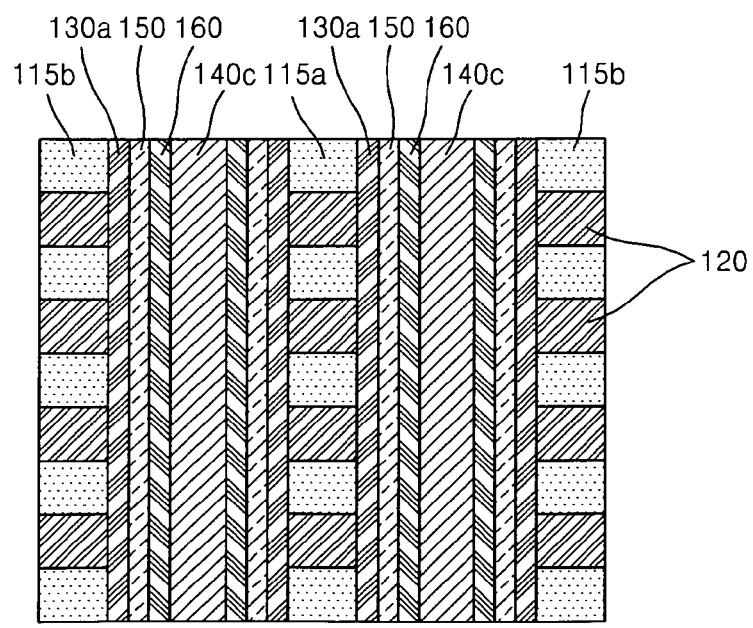

FIG. 7 is a perspective view of a non-volatile memory device 300c having a stacked structure according to example embodiments. FIG. 8 is a cross-sectional view taken along line VIII-VIII' of the non-volatile memory device 300c of FIG. 7. Referring to FIGS. 7 and 8, a plurality of non-volatile memory devices 300a of FIG. 6 may be arrayed in a single layer or stacked in a plurality of layers. For example, a plurality of pairs of first electrode lines 115a and 115b may be stacked in a plurality of layers. In example embodiments, an insulating layer 120 may be interposed between first electrode lines 115a and 115b that are stacked in different layers.

A plurality of pairs of first and second word lines 117a and 117b may be stacked in a plurality of layers like the first electrode lines 115a and 115b. Accordingly, first electrode lines 115a and 115b belonging to different layers may be separated from one another, and first and second word lines 117a and 117b belonging to different layers may be separated from one another.

Second electrode lines 140c may perpendicularly extend along sidewalls of the stack of first electrode lines 115a and 115b. Accordingly, a second electrode lines 140c may be shared by first electrode lines 115a and 115b that are stacked in different layers. Although the second electrode line 140c are shared by the first electrode lines 115a and 115b that are stacked in the different layers, because the first electrode lines 115a and 115b are separated from each other, memory cells belonging to the different layers may be operated separately.

The at least one data storage layer 130a may perpendicularly extend along the sidewalls of the stack of first electrode lines 115a and 115b. The at least one data storage layer 130a may extend up to sidewalls of the first and second word lines 117a and 117b. For example, the at least one data storage layer 130a may have a cylindrical shape surrounding sidewalls of the second electrode lines 140c arranged in a column. The operation of the non-volatile memory device 300c may be almost the same as that of the non-volatile memory device 100c of FIG. 3, and thus a repeated explanation thereof will not be given.

Figure 9:
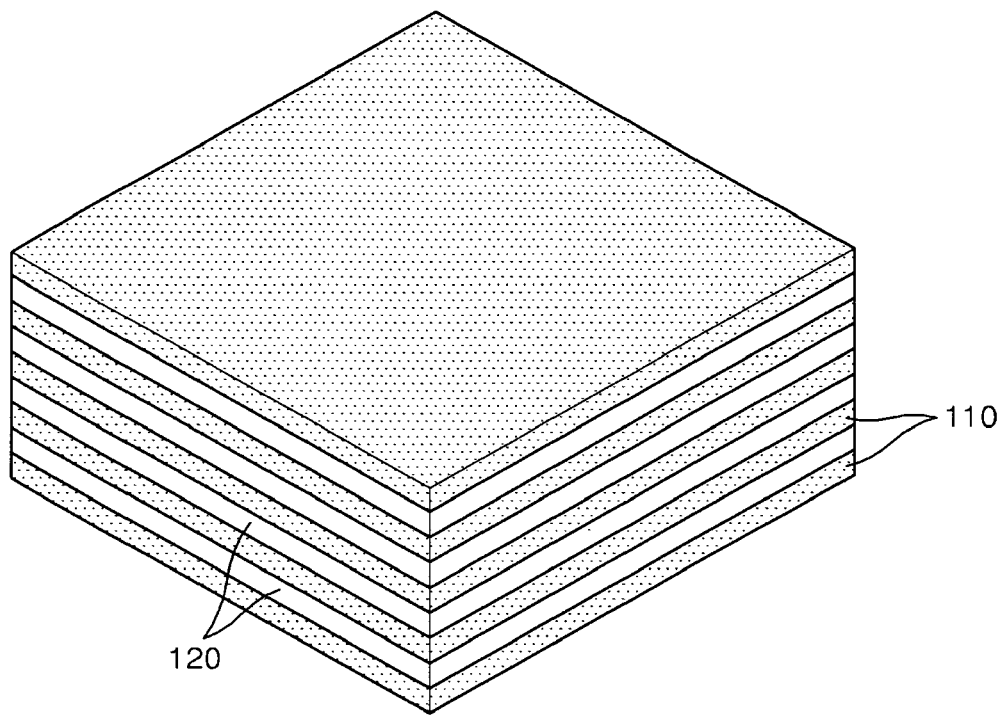

FIGS. 9 through 14 are perspective views illustrating a method of fabricating a non-volatile memory device according to example embodiments. Referring to FIG. 9, a plurality of first electrode layers 110 and a plurality of insulating layers 120 may be alternately stacked. For example, each of the first electrode layers 110 may be a semiconductor layer, for example, an epitaxial layer or a polysilicon layer. The first electrode layers 110 may be doped with impurities of a first conductive type.

Figure 10:
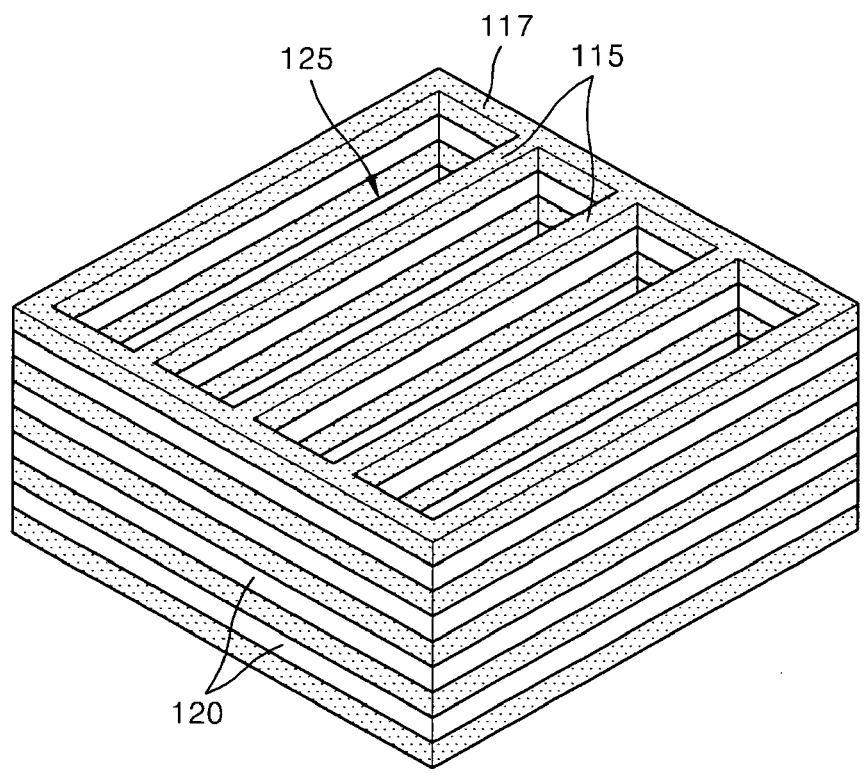

Referring to FIG. 10, a plurality of trenches 125 may be formed in the first electrode layers 110 and the insulating layers 120. Parts of the first electrode layers 110 arranged in a plurality of columns along sidewalls of the trenches 125 may be defined as first electrode lines 115. Parts of the first electrode layers 110 arranged along ends of the trenches 125 may be defined as a word line 117. Accordingly, the trenches 125 may be formed according to shapes of the first electrode lines 115 and the word line 117.

Figure 11:
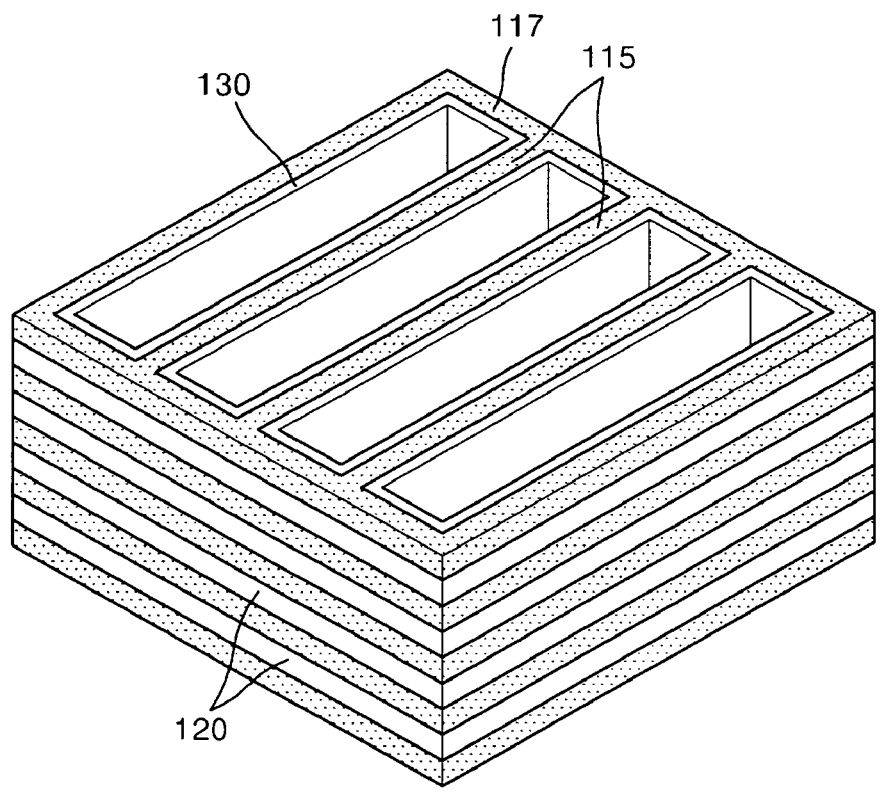

Referring to FIG. 11, the at least one data storage layer 130 may be formed in each of the trenches 125. Accordingly, the at least one data storage layer 130 may perpendicularly extend along sidewalls of the stack of first electrode lines 115 and have a predetermined or given thickness so as not to fill the trenches 125. For example, the at least one data storage layer 130 may include a phase-change resistor, a variable resistor, or a material having a dielectric breakdown.

Figure 12:
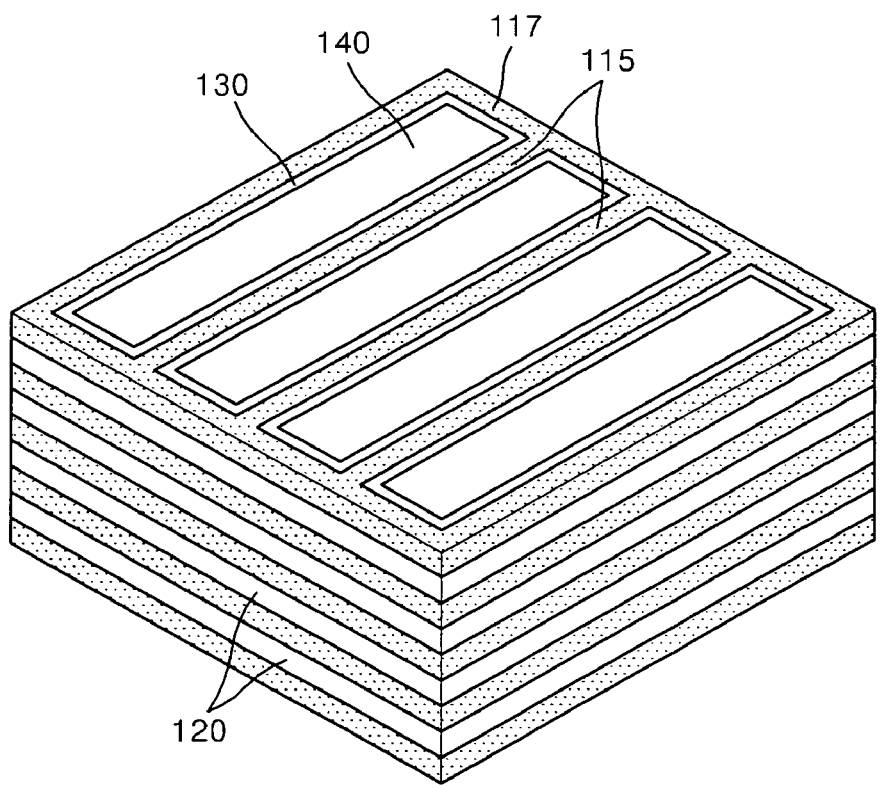

Referring to FIG. 12, a second electrode layer 140 may be formed on the at least one data storage layer 130 to fill up the trenches 125. For example, the second electrode layer 140 may be formed by forming a semiconductor layer of a second conductive type by using chemical vapor deposition (CVD) and planarizing the semiconductor layer. For example, the second electrode layer 140 may be an epitaxial layer or a polysilicon layer, and doped with impurities of a second conductive type. The planarization may be performed by etch back or chemical mechanical polishing (CMP).

Figure 13:
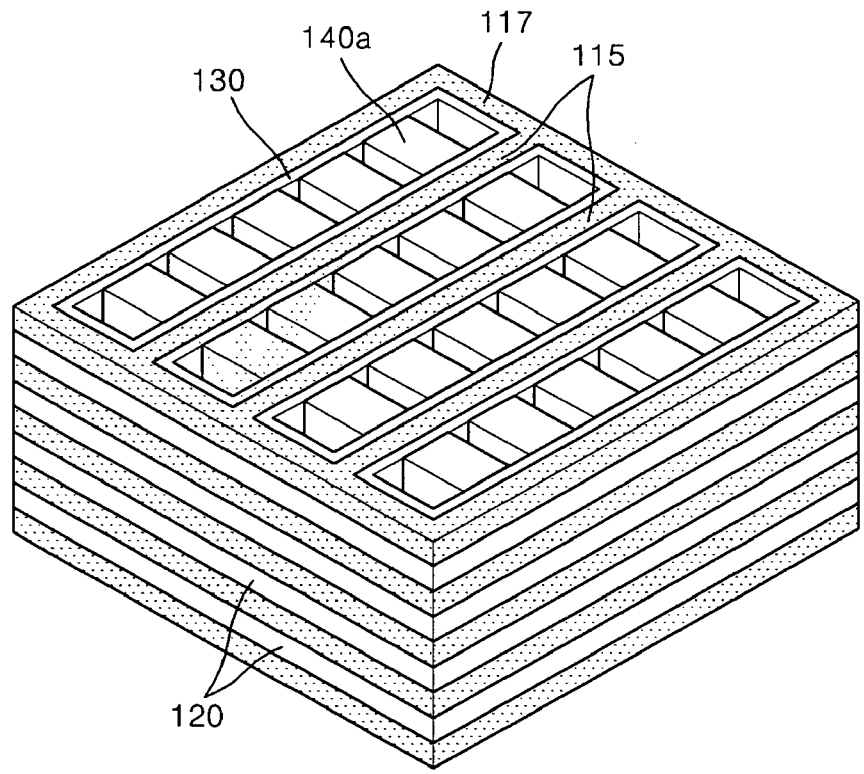

Referring to FIG. 13, the second electrode layer 140 may be patterned to be interposed between the first electrode lines 115 such that a plurality of second electrode lines 140a spaced apart from one another along the first electrode lines 115 are defined. The patterning may be performed by photolithography and etching. The width and number of the second electrode lines 140a may be properly adjusted according to the capacity of a non-volatile memory device.

Figure 14:
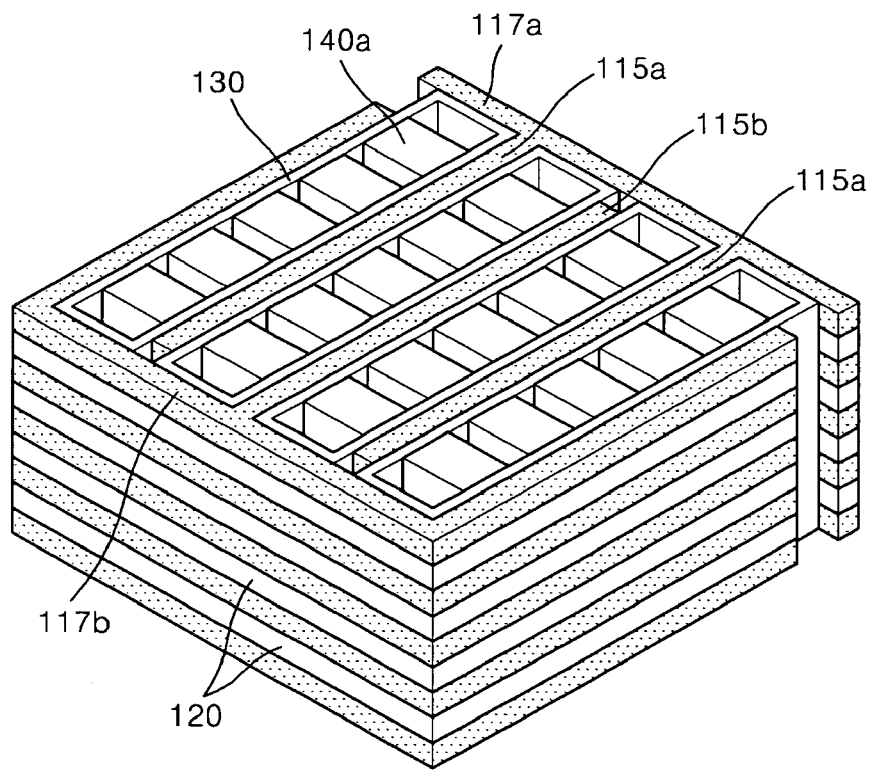

Referring to FIG. 14, the first electrode lines 115 may be divided into first electrode lines 115a and 115b, and the word line 117 may be divided into a first word line 117a and a second word line 117b. For example, even first electrode lines among the first electrode lines 115 may be defined as the first electrode lines 115a, and odd first electrode lines among the first electrode lines 115 may be defined as the first electrode lines 115b.

The first word line 117a may be connected to the first electrode lines 115a and separated from the first electrode lines 115b. The second word line 117b may be connected to the first electrode lines 115b and separated from the first electrode lines 115a. The non-volatile memory devices 100a, 100b, and 100c of FIGS. 1 through 4 may be fabricated using the aforementioned method of FIGS. 9-14. The method of FIGS. 9-14 may simultaneously form a stack of memory cells, thereby simplifying manufacturing processes and reducing manufacturing costs.

Figure 15:
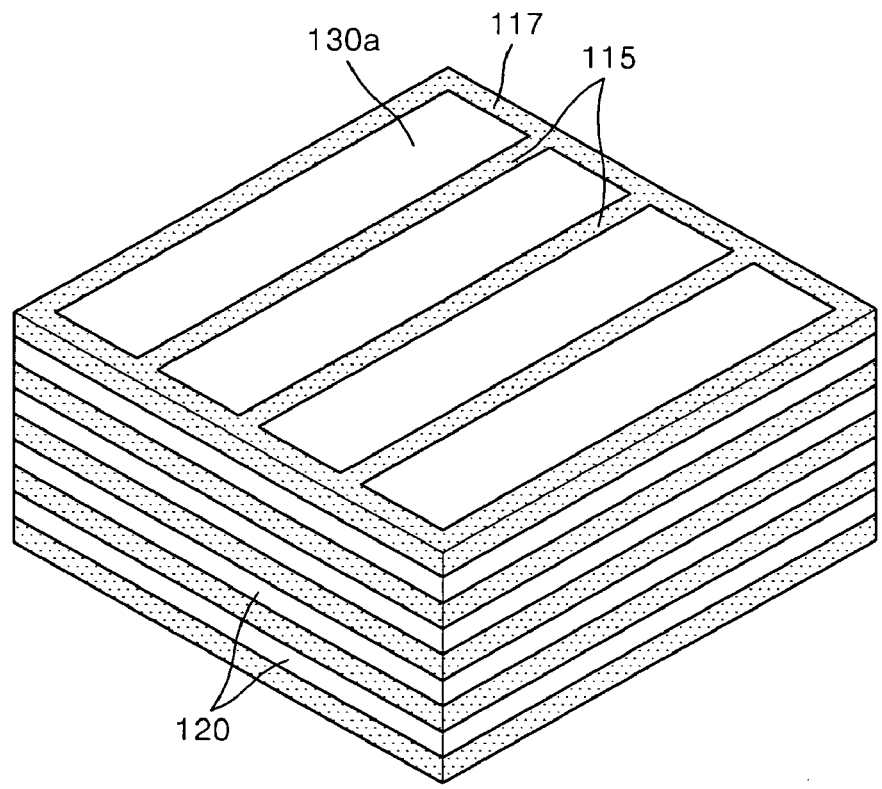
Figure 16:
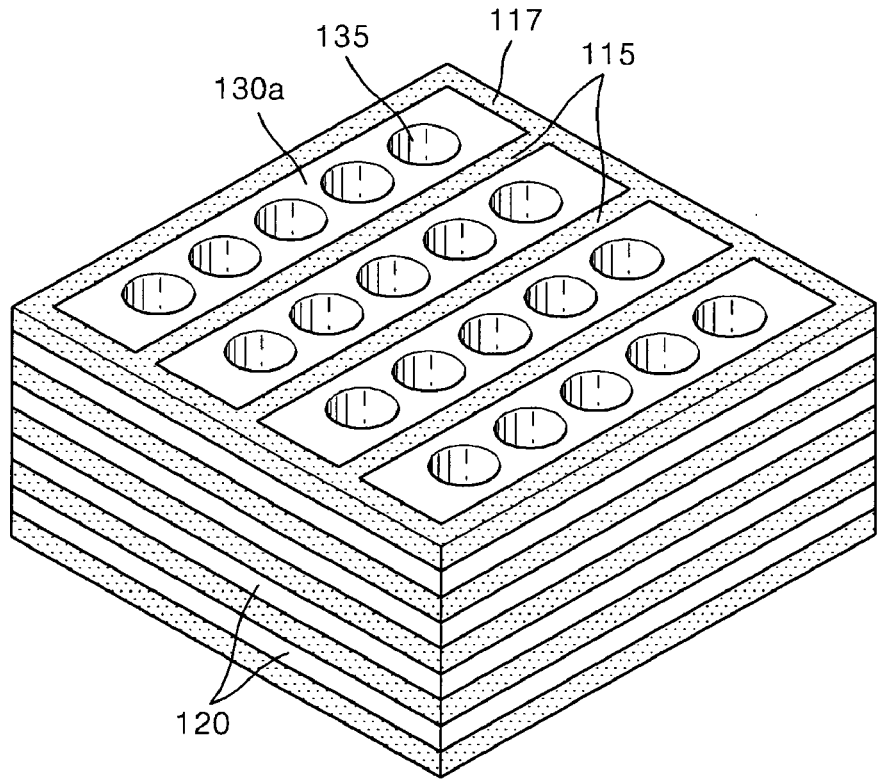
Figure 17:
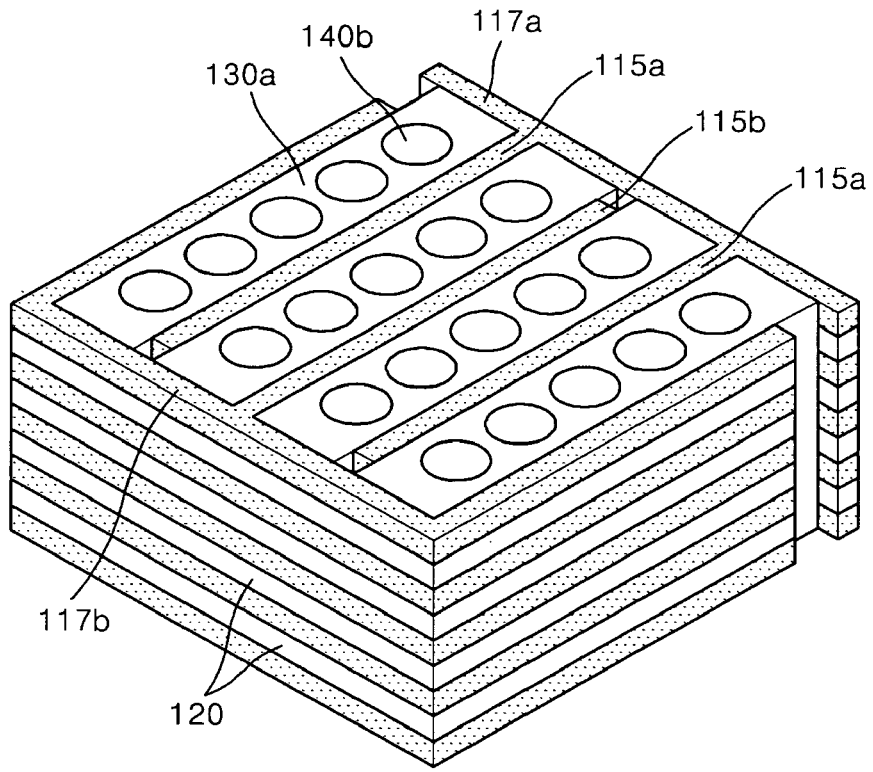

FIGS. 15 through 17 are perspective views illustrating a method of fabricating a non-volatile memory device according to example embodiments. An operation of FIG. 15 may be performed after the operations of FIGS. 9 and 10. Referring to FIG. 15, the at least one data storage layer 130a may be formed to fill the trenches 125. The at least one data storage layer 130a may be formed by forming a phase-change resistor layer, a variable resistor layer, or a layer having a dielectric breakdown, by using CVD, and planarizing the formed layer. For example, the planarization may be performed by etch back or CMP.

Referring to FIG. 16, a plurality of holes 135 may be formed in the at least one data storage layer 130a. For example, the holes 135 may be formed by photolithography and etching. Referring to FIG. 17, second electrode lines 140b may fill the holes 135. The second electrode lines 140b may be formed by forming a second electrode layer using CVD and planarizing the second electrode layer. For example, the second electrode lines 140b may be formed of a semiconductor of a second conductive type.

The first electrode lines 115 may be divided into first electrode lines 115a and 115b and the word line 117 may be divided into a first word line 117a and a second word line. The first word line 117a may be connected to the first electrode lines 115a and separated from the first electrode lines 115b. The second word line 117b may be connected to the first electrode lines 115b and separated from the first electrode lines 115a. The non-volatile memory device 200 of FIG. 5 may be fabricated by using the aforementioned method of FIGS. 15 through 17.

Figure 18:
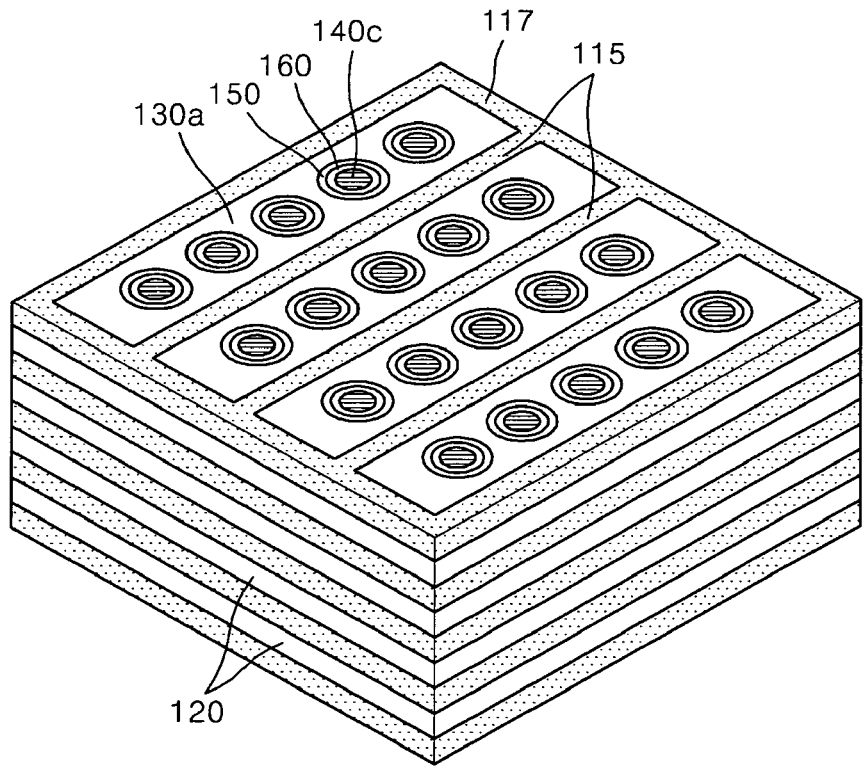
Figure 19:
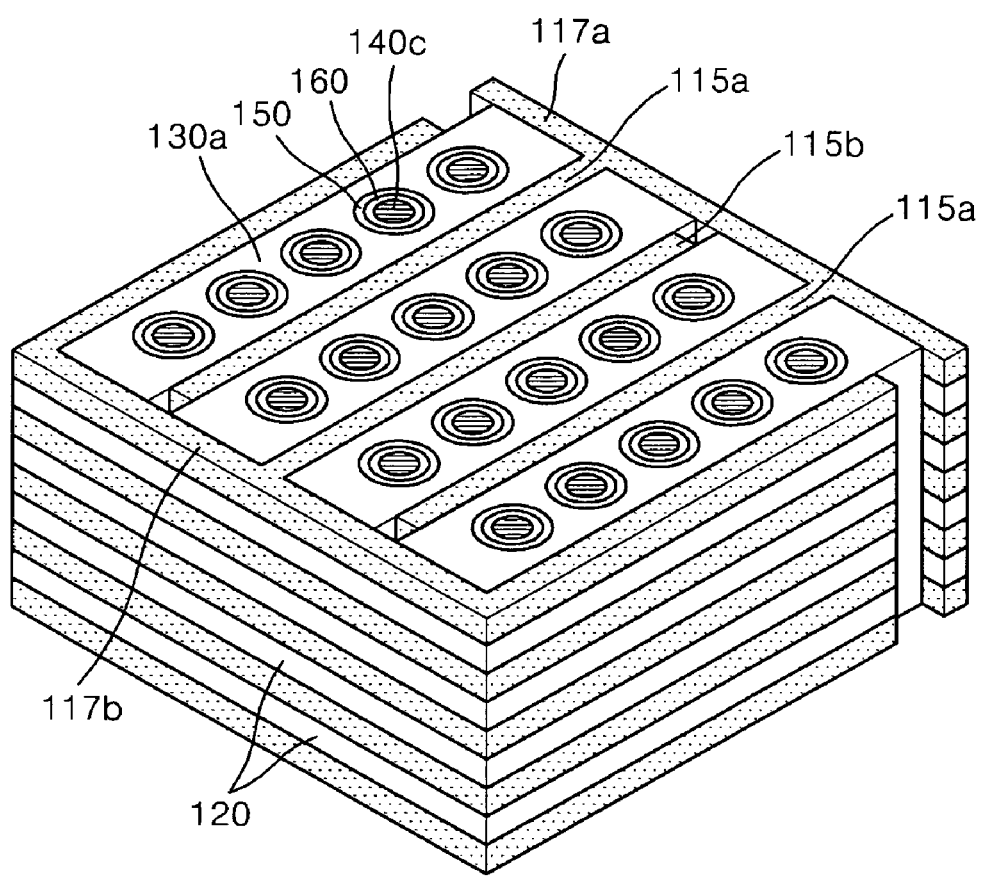

FIGS. 18 and 19 are perspective views illustrating a method of fabricating a non-volatile memory device according to example embodiments. An operation of FIG. 18 may be performed after the operation of FIG. 16. However, a first electrode layer 110 in FIG. 18 may include a conductor. Referring to FIG. 18, a first semiconductor layer 150 may be formed on a surface of the at least one data storage layer 130a in the holes 135. A second semiconductor layer 160 may be formed on the first semiconductor layer 150. Second electrode lines 140c may be formed on the second semiconductor layer 160 to fill the holes 135.

Referring to FIG. 19, the first electrode lines 115 may be divided into first electrode lines 115a and 115b and the word line 117 may be divided into first and second word lines 117a and 117b. The first word line 117a may be connected to the first electrode lines 115a and separated from the first electrode lines 115b. The second word line 117b may be connected to the first electrode lines 115b and separated from the first electrode lines 115a. The non-volatile memory devices 300a and 300c of FIGS. 6 through 8 may be fabricated by using the aforementioned method of FIGS. 18 and 19.

As taught above, the data storage layer, according to example embodiments, may include a phase change resistor, e.g. a chalcogenic compound (GST). Example embodiments, however, are not limited to GST. For example, the phase change material may also include arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change resistor may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change resistor may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se). The above list is not limiting as one skilled in the art would recognize a variety of other suitable phase-change materials suitable for use in the data storage layer.

As described above, the non-volatile memory device according to example embodiments may be more easily stacked in a plurality of layers. Accordingly, the non-volatile memory device may achieve increased capacity and increased integration by increasing the number of stacks of memory cells, e.g., the number of stacks of first electrode lines. Accordingly, the non-volatile memory device according to example embodiments may be suitable for highly-integrated high-capacity products.

Moreover, the method of fabricating the non-volatile memory device according to example embodiments may simultaneously fabricate a stack of memory cells, thereby simplifying manufacturing processes and reducing manufacturing costs.

Although example embodiments have been described with reference to the accompanying drawings, it will be apparent to those skilled in the art that various modifications and changes may be made thereto without departing from the scope and spirit of example embodiments. Therefore, it should be understood that the above embodiments are not limitative, but illustrative in all aspects.

What is claimed is:

1. A non-volatile memory device comprising:
   at least one pair of first electrode lines;
   at least one second electrode line between the at least one pair of first electrode lines;
   at least one data storage layer between the at least one pair of first electrode lines and the at least one second electrode line and locally storing a resistance change, wherein the at least one pair of first electrode lines is adjacent to each other and are not electrically connected to each other;
   a first word line electrically connecting even first electrode lines among the plurality of first electrode lines; and
   a second word line electrically connecting odd first electrode lines among the plurality of first electrode lines,
   wherein the at least one pair of first electrode lines comprise a semiconductor of a first conductive type, and the at least one second electrode line comprises a semiconductor of a second conductive type that is opposite to the first conductive type.

2. The non-volatile memory device of claim 1, wherein either the first conductive type or the second conductive type is an n type and the other is a p type.

3. The non-volatile memory device of claim 1, wherein the at least one second electrode line comprises a plurality of second electrode lines spaced apart from one another.

4. The non-volatile memory device of claim 3, wherein the at least one data storage layer extends along the plurality of first electrode lines.

5. The non-volatile memory device of claim 1, wherein the at least one data storage layer is between the at least one pair of first electrode lines to surround the at least one second electrode line.

6. The non-volatile memory device of claim 1, wherein the at least one second electrode line has a cylindrical or polyprism shape.

7. The non-volatile memory device of claim 1, wherein the at least one data storage layer comprises a variable resistor or a phase-change resistor.

8. The non-volatile memory device of claim 1, wherein the at least one data storage layer comprises an oxide having a dielectric breakdown that stores data only once.

9. The non-volatile memory device of claim 1, wherein the at least one pair of first electrode lines comprise a plurality of first electrode lines arranged parallel to one another, wherein the at least one second electrode line comprises a plurality of second electrode lines between the plurality of first electrode lines.

10. The non-volatile memory device of claim 1, wherein the first word line and the second word line are separately disposed on both ends of the plurality of first electrode lines.

11. The non-volatile memory device of claim 1, wherein the at least one pair of first electrode lines comprise a plurality of pairs of first electrode lines stacked in a plurality of layers.

12. The non-volatile memory device of claim 1, further comprising:
   a substrate, wherein the at least one second electrode line comprises a plurality of second electrode lines spaced apart from one another and each of the second electrode lines extends perpendicularly from the substrate.

13. The nonvolatile memory device of claim 1, wherein
   the at least one pair of first electrode lines includes a first pair of first electrode lines stacked on a second pair of first electrode lines with an insulation layer therebetween, the insulation layer electrically isolating the first pair of first electrode lines from the second pair of first electrode lines,
   the at least one second electrode line extends between the first pair of first electrode lines and extends between the second pair of first electrode lines, and
   each of the first electrode lines of the first pair and the second pair of first electrode lines are electrically isolated from one another.

14. A non-volatile memory device comprising:
   at least one pair of first electrode lines;
   at least one second electrode line between the at least one pair of first electrode lines;
   at least one data storage layer between the at least one pair of first electrode lines and the at least one second electrode line and locally storing a resistance change, wherein the at least one pair of first electrode lines is adjacent to each other and are not electrically connected to each other;
   a first semiconductor layer of a first conductive type between the at least one second electrode line and the at least one data storage layer; and
   a second semiconductor layer of a second conductive type, which is opposite to the first conductive type, between the first semiconductor layer and the at least one second electrode line,
   wherein the at least one pair of first electrode lines comprise a semiconductor of a first conductive type, and the at least one second electrode line comprises a semiconductor of a second conductive type that is opposite to the first conductive type.

15. The non-volatile memory device of claim 14, wherein the at least one pair of first electrode lines and the at least one second electrode line comprise conductors.

16. The non-volatile memory device of claim 10, wherein the at least one second electrode line perpendicularly extends along the stack of first electrode lines.

17. The non-volatile memory device of claim 10, wherein the at least one data storage layer perpendicularly extends along the stack of first electrode lines.

18. A non-volatile memory device comprising:
   at least one pair of first electrode lines;
   at least one second electrode line between the at least one pair of first electrode lines; and
   at least one data storage layer between the at least one pair of first electrode lines and the at least one second electrode line and locally storing a resistance change, wherein the at least one pair of first electrode lines is adjacent to each other and are not electrically connected to each other, wherein the at least one pair of first electrode lines includes a first electrode line, a second first electrode line, a third first electrode line, and a fourth first electrode line on substantially the same plane such that the second first electrode line is between the first electrode line and the third first electrode line, the third first electrode line is between the second first electrode line and the fourth first electrode line, and the second first electrode line and the third first electrode line are between the first first electrode line and the fourth first electrode line, the first electrode line and the third first third electrode line are electrically connected to a first word line and the second first electrode line and the fourth first electrode line are connected to a second word line, and the first electrode line and the third first electrode line are not electrically connected to the second word line and the second first electrode line and the fourth first electrode line are not electrically connected to the first word line, the at least one second electrode line is a plurality of second electrode lines between the first electrode line and the second first electrode line, the second first electrode line and the third first electrode line, and the third first electrode line and the fourth first electrode line, and the at least one data storage layer is a plurality of data storage layers between the plurality of second electrode lines and the first electrode line, the second first electrode line, the third first electrode line, and the fourth first electrode line, wherein the at least one pair of first electrode lines comprise a semiconductor of a first conductive type, and the at least one second electrode line comprises a semiconductor of a second conductive type that is opposite to the first conductive type.

* * * * *